United States Patent [19]

Tanoi et al.

[11] Patent Number: 5,577,223
[45] Date of Patent: Nov. 19, 1996

[54] DYNAMIC RANDOM ACCESS MEMORY (DRAM) WITH CACHE AND TAG

[75] Inventors: Satoru Tanoi; Yasuhiro Tanaka; Tetsuya Tanabe, all of Tokyo, Japan

[73] Assignee: Oki Electric Industry Co., Ltd., Tokyo, Japan

[21] Appl. No.: 297,450

[22] Filed: Aug. 29, 1994

[30] Foreign Application Priority Data

Aug. 31, 1993 [JP] Japan ..................................... 5-216027

[51] Int. Cl.$^6$ ..................................................... G06F 12/00
[52] U.S. Cl. .............................. 395/445; 395/432; 365/49; 365/230.03
[58] Field of Search ..................................... 395/431, 432, 395/435, 445; 365/230.03, 227, 49, 189.05

[56] References Cited

U.S. PATENT DOCUMENTS

| | | | |
|---|---|---|---|
| 4,241,425 | 12/1980 | Cenker | 365/222 |
| 5,111,386 | 5/1992 | Fujishima | 395/445 |
| 5,214,610 | 8/1991 | Houston | 365/233.5 |
| 5,226,147 | 8/1990 | Fujishima | 395/445 |
| 5,251,176 | 10/1993 | Komatsu | 365/222 |
| 5,301,162 | 4/1994 | Shimizu | 365/230.03 |
| 5,455,796 | 10/1995 | Inui | 365/201 |

FOREIGN PATENT DOCUMENTS

0552667A1   7/1993   European Pat. Off. .

OTHER PUBLICATIONS

K. Arimoto et al, "A Circuit Design of Intelligent CDRAM with Automatic Write Back Capability", 1990 Symposium on VLSI Circuits, IEEE 1990.

Chou et al., "A 60–ns 16–Mbit DRAM with a Minimized Sensing Delay Caused by Bit–Line Stray Capacitance," *IEEE Journal of Solid–State Circuits*, vol. 24, No. 5, Oct. 1989, New York, NY, USA, pp. 1176–1183.

Lu et al., "A 20–ns 128–kbit×4 High–Speed DRAM with 330–Mbit/s Data Rate", *IEEE Journal of Solid–State Circuits*, vol. 23, No. 5, Oct. 1988, New York, NY, USA, pp. 1140–1149.

Niijima et al., "QRAM—Quick Access Memory System", *Proceedings of the 1990 IEEE International Conference on Computer Design: VLSI in Computers and Processors*, Cambridge, MA, USA, Sep. 17–19, 1990, pp. 417–420.

Shah et al., "A 4–Mbit DRAM with Trench–Transistor Cell", *IEEE Journal of Solid–State Circuits*, vol. SC–21, No. 5, Oct. 1986, New York, NY, USA, pp. 618–626.

*Primary Examiner*—Tod R. Swann
*Assistant Examiner*—Christopher S. Chow
*Attorney, Agent, or Firm*—Law Office of Steven M. Rabin, P.C.

[57] ABSTRACT

A dynamic RAM having a TAG address holding circuit in a TAG block in correspondence with one of a plurality of sub-arrays to hold the lower bits of an X (row) address. A block control circuit in the TAG block determines a "Hit" or "Miss" in accordance with the held address and a new X address in response to the sub-address and outputs a TAG determination signal. In response to the TAG judgment signal, a sub-array control circuit transfers a signal for access to the TAG block and a column sense amplifier. The column sense amplifier is utilized as a cache and data latched in the column sense amplifier are read out on a data bus when a "Hit" is determined.

16 Claims, 14 Drawing Sheets

FIG. 9

| INPUT ADDRESS (ADD) | BIT CODE FOR INTERMEDIATE ADDRESS | | BIT CODE FOR TAG BLOCK BLOK 210 | | RESULT OF JUDGEMENT (LEVEL OF HIT/MISS LINE) | ADDRESS COMPARISON CIRCUIT HAVING "ON" STATE |
|---|---|---|---|---|---|---|
| A3 A2 A1 A0 | a7 a6 a5 a4 | a3 a2 a1 a0 | ADDRESS | BITCODE 2111 2112 2113 2114 2115 2116 2117 2118 | | |
| 0 0 0 0 | 0 0 0 0 | 0 0 0 1 | 0 0 0 0 | – – – – | H (MATCH) | NONE |
| 0 0 0 1 | 0 0 0 0 | 0 0 1 0 | 0 0 0 0 | o o o o | L (MISMATCH) | 2132 |
| 0 0 1 0 | 0 0 0 0 | 0 0 1 0 | 0 0 0 1 | o o o o | L (MISMATCH) | 2133 |
| 0 0 1 1 | 0 0 0 0 | 0 0 0 1 | 0 0 1 0 | o o o o | L (MISMATCH) | 2134 |
| | | | | 2111 o o o o | | |
| | | | | 2112 – – – – | | |
| | | | | 2113 o o o o | | |
| | | | | 2114 o o o o | | |
| | | | | 2115 o o o o | | |
| | | | | 2116 o o o o | | |
| | | | | 2117 o o o o | | |
| | | | | 2118 o o o o | | |
| 0 0 0 0 | 0 0 0 0 | 0 0 0 1 | 0 0 0 0 | | L (MISMATCH) | 2131 |
| 0 0 0 1 | 0 0 0 0 | 0 0 1 0 | 0 0 0 0 | | H (MATCH) | NONE |
| 0 0 1 0 | 0 0 0 0 | 0 0 1 0 | 0 0 0 1 | | L (MISMATCH) | 2133 |
| 0 0 1 1 | 0 0 0 0 | 0 0 0 1 | 0 0 1 0 | | L (MISMATCH) | 2134 |
| | | | | 2111 o o o o | | |
| | | | | 2112 o o o o | | |
| | | | | 2113 o o o o | | |
| | | | | 2114 – – – – | | |
| | | | | 2115 o o o o | | |
| | | | | 2116 o o o o | | |
| | | | | 2117 o o o o | | |
| | | | | 2118 o o o o | | |
| 0 0 0 0 | 0 0 0 0 | 0 0 0 1 | 0 0 0 0 | | L (MISMATCH) | 2131 |
| 0 0 0 1 | 0 0 0 0 | 0 0 1 0 | 0 0 0 0 | | L (MISMATCH) | 2132 |
| 0 0 1 0 | 0 0 0 0 | 0 0 1 0 | 0 0 0 1 | | L (MISMATCH) | 2133 |
| 0 0 1 1 | 0 0 0 0 | 0 0 0 1 | 0 0 1 0 | | H (MATCH) | NONE |

DYNAMIC RANDOM ACCESS MEMORY (DRAM) WITH CACHE AND TAG

REFERENCE TO RELATED APPLICATION

This application claims the priority right under 35 U.S.C. 119, of Japanese Patent Application No. Hei 05-216027 filed Aug. 31, 1993, the entire disclosure of which is incorporated herein by reference.

BACKGROUND OF THE INVENTION

1. Field of the Invention

The present invention relates to a dynamic random access memory (hereinafter simply referred to as DRAM), and more particularly, to a high speed DRAM with a cache.

2. Description of Related Art

High speed data transmission has been realized by incorporating a cache function into a large scale DRAM. This kind of DRAM incorporates a cache memory and a TAG memory, which generates a state flag indicating a "Hit" or "Miss" regarding data stored in the cache memory, all on an integrated circuit (IC) chip.

Related technology employing an SRAM as the cache memory is, for example, disclosed in "A Circuit Design Of Intelligent CDRAM With Automatic Write Back Capability", pp. 79–80, 1990 Symposium on VLSI circuits digest of technical papers, June 7–9, The IEEE Solid State-Circuits Council and The Japan Society of Applied Physics, authored by K. Arimoto et al.

In this SRAM design, a TAG memory stores an X address and a Y address as a pair of TAG addresses, and the SRAM cache stores data corresponding to the TAG address. When the X address and the Y address are defined in a read operation, confirmation will be made as to whether a TAG address exists that corresponds to the X and Y addresses. If the TAG address is found in the TAG memory, that is, if there is a "hit", the corresponding data are read out from the SRAM cache at high speed.

In this manner, high speed access to stored data can be accomplished by incorporating the TAG memory and the SRAM cache into the DRAM circuit. However, this method requires use of both the X address and the Y address to map column sense amplifier data into the SRAM cache. Further, a refresh operation is performed in each memory cell sub-array. Column sense amplifier data renewed in the refresh operation do not always correspond to the TAG addresses in the TAG memory.

Moreover, an external X address or Y address is directly written into the TAG memory through a buffer circuit without performing a logic level conversion process. When the external address is directly written into the TAG memory through a buffer circuit in this manner, the TAG memory included in a large scale memory which requires stepped address decoding should be located in front of the first decoding circuit in order to avoid needlessly lengthy wiring between components. As a result, layout options are restricted for the TAG memory in a DRAM having such a configuration because the TAG memory should be located along side the Y decoder to make component connection practicable.

Moreover, when an address multiplexer type interface is employed, so that the X address and the Y address are multiplexed and transmitted, the "hit" or "miss" determination in the TAG memory cannot be performed until both the X address and the Y address are completely written to memory. Since data are read out through a memory cell (MC) after a "miss" determination, access time delay after a "miss" determination increases dramatically.

Moreover, using the SRAM cache as the cache memory necessitates an enlargement of the chip size, causing an increase in the cost to manufacture and use the chip.

To solve the above-mentioned problems, designs utilizing sense amplifiers of the DRAM circuit as the cache have been proposed. Such technology is disclosed, for example, in "To Realize 500M Bytes/sec Data Transmission Speed By 72 Bit Row Operation" pp. 75–80, August 1992, Nikkei Microdevices, authored by N. Kushiyama et al. This DRAM, which controls the sense amplifier as the cache, requires that data of the column sense amplifiers be renewed, so the corresponding addresses in the TAG memory must be purged. However, conventional DRAMs utilizing sense amplifiers as the cache have only two TAG blocks included in the TAG memory on the chip, so different TAG information cannot be stored in each of the X decoders, which may cause a decrease in the "hit" rate.

Further, the TAG memory assignment in such a DRAM corresponds to plural sub-arrays, each of which incorporates an X decoder, and the TAG memory is located in a different region in the memory array on the chip layout. A layout having these TAG blocks requires the use of lengthy bus wiring, hindering efforts to decrease the size of the TAG blocks.

As described above, a conventional DRAM structure incorporating TAG memory encounters difficulties both in reducing the chip size and in improving the hit rate.

SUMMARY OF THE INVENTION

Accordingly, it is an object of the present invention to provide a DRAM including a cache wherein the design does not require an increase in chip size.

It is another object of the present invention to provide a DRAM including a cache wherein the design enables a reduction in chip size without reducing the hit rate.

It is still another object of the present invention to provide a DRAM including a cache wherein the TAG memory layout is not restricted to a particular arrangement.

To accomplish these and other objects, there is provided a dynamic RAM including a plurality of sub-arrays having a plurality of memory cells, each of the memory cells being connected with each of cross points between a plurality of word lines and bit lines; an X decoder for decoding an X address and selecting the word line; a column sense amplifier for detecting and amplifying data on the bit line read out from the memory cell; a sub-array control circuit for controlling the column sense amplifier as a cache; and a TAG memory having a plurality of TAG blocks, each of the TAG blocks storing a TAG address assigned to the sub-arrays concurrently activated at a time of access, for providing an address having a logically equivalent value to that of the X address.

In accordance with another aspect of the present invention, there is provided a dynamic RAM including: a plurality of sub-arrays having a plurality of memory cells, each of the memory cells being connected with each of cross points between a plurality of word lines and bit lines; an X decoder for decoding an X address and selecting the word line; a column sense amplifier for detecting and amplifying data on the bit line read out from the memory cell; a TAG memory having a plurality of TAG blocks, each of the TAG blocks storing a TAG address assigned to the sub-arrays concurrently activated at a time of access, for providing an address having a logically equivalent value to that of the X address; a plurality of sub-array control circuit disposed in each the TAG blocks for controlling the column sense amplifier as a cache; and a sense amplifier mediation circuit for validating one and invalidating another output to partial outputs of a pair of the sub-array control circuit mutually arrayed adjacently with each other.

In accordance with still another aspect of the present invention, there is provided a dynamic RAM employing a sub-array having a plurality of memory cells respectively connected with each of cross points between a plurality of word lines and bit lines and a decoder circuit for decoding an address and selecting the memory cells, the dynamic RAM including: a first decoding circuit for predecoding an address and outputting an intermediate address; a first intermediate address bus for transmitting the intermediate address; and a TAG memory including a plurality of blocks and connected with the first intermediate address bus; each block of the TAG memory further including: a TAG address circuit for loading and storing the intermediate address and for providing the intermediate address to the decoding circuit; an address comparison circuit for comparing an address on the intermediate address bus with a stored address in the TAG address holding circuit; and a purge circuit for inactivating all bits held by the TAG address holding circuit.

In accordance with further aspect of the present invention, there is provided a dynamic RAM including: a plurality of sub-arrays having a plurality of memory cells, each of the memory cells being connected with each of cross points between a plurality of word lines and bit lines; a plurality of TAG blocks for holding as a set of TAG addresses an X address for selecting a memory cell of the sub-array; and an X decoder provided in each of sub-arrays for decoding the X address and selecting the word line; each of the corresponding TAG blocks being located adjacent to the X decoder provided in each sub-array.

According to the present invention, the plural sub-arrays store data and the X decoder decodes the X address to selectively activate the word lines in the sub-arrays. The column sense amplifiers detect and amplify the read-out data on the bit lines in the sub-arrays. The TAG block in the TAG memory holds the common TAG address for the respective plural sub-arrays concurrently activated, and the sub-array control circuit controls the column sense amplifiers as the cache in accordance with the TAG address. For example, when a "hit" is recognized during a read operation, data latched on the corresponding column sense amplifiers are read out.

Further, according to another aspect of the present invention, the plural sub-arrays store data and the X decoder decodes the X address to selectively activate the word lines in the sub-arrays. The column sense amplifiers detect and amplify data read out from the bit lines in each of the subarrays to each of the adjacent sub-arrays. The TAG block in the TAG memory holds the common TAG address for the respective plural sub-arrays concurrently activated and the sub-array control circuit controls the column sense amplifier as the cache. The sense amplifier mediation circuit determines one to be valid and the other to be invalid for the portion of the outputs from the adjacent sub-array control circuit.

Moreover, according to another aspect of the present invention, a first decoder circuit predecodes the address to output an intermediate address. The TAG address holding circuit in the TAG memory loads and holds the intermediate address through the intermediate address bus and supplies the intermediate address to the decoder circuit of the DRAM as well. Further, the address comparison circuit compares the address on the intermediate address bus with that stored in the TAG address holding circuit, and the purge circuit inactivates all the bits of the address stored in the TAG address holding circuit.

The determination as to "hit" or "miss" is performed in accordance with the above described processes. The plural sub-arrays hold data and the decode circuit decodes the address to select the memory cell (MC) in the sub-array.

Further, according to still another aspect of the present invention, the X decoder and the TAG memory are disposed such that they are adjacent and in parallel with each other on the chip, and the corresponding TAG blocks are also disposed adjacent to the X decoders prepared for each sub-array. As a result, the chip size can be reduced and various wiring connections can be shortened, allowing the high speed DRAM to be realized.

BRIEF DESCRIPTION OF DRAWINGS

FIG. 9 is a logic table illustrating operation of the design shown in FIG. 8;

DETAILED DESCRIPTION OF THE PREFERRED EMBODIMENTS

Now, a detailed description will be made as to the embodiments of a DRAM with a cache according to the present invention in reference to the attached drawings. Prior to the description of the embodiments of the present invention, a related design shown in FIG. 2 will be described in order to provide background for understanding the present invention.

Figure 2:
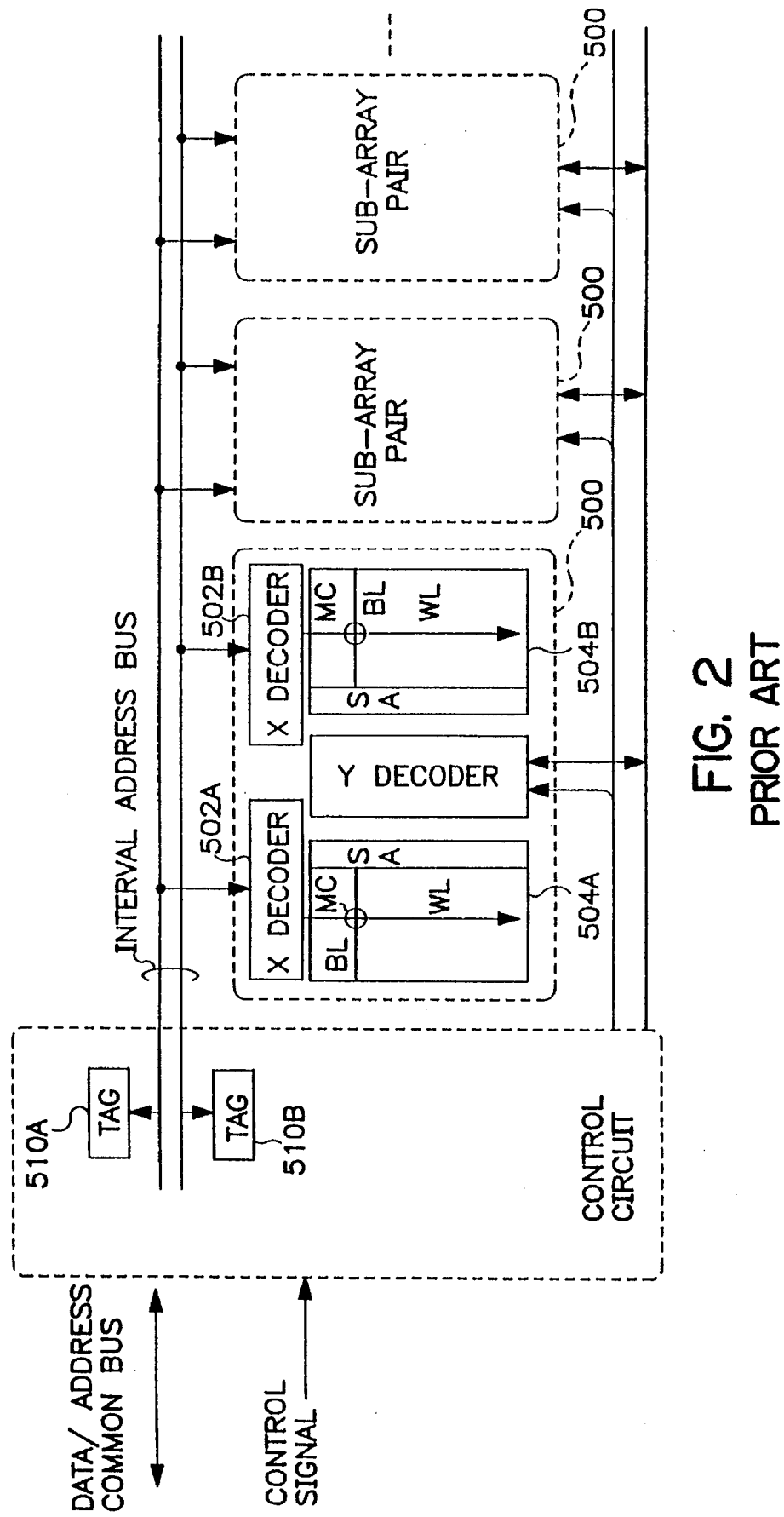
FIG. 2 is a block diagram of a related design of a DRAM with a cache.

FIG. 2 is a block diagram illustrating a related design of the present invention regarding a DRAM utilizing a sense amplifier as a cache. As shown in FIG. 2, a TAG memory 510 is disposed in a control circuit which feeds control signals, as well as input and output signals on a data/address common bus. It should be noted that in referring to addressing, the addresses will be designated generically as either "X" or "Y". For purposes of the following disclosure, all "X" addressing references will correspond to row addressing, and all "Y" addressing references will correspond to column addressing. A TAG memory 510A and a TAG memory 510B are respectively connected with X decoders 502A and 502B in each plural sub-array pair 500 which includes sub-arrays 504A and 504B disposed on cross points (memory cells MC) between the word lines WL and the bit lines BL. In other words, two TAG memories 510A and 510B on a chip are arranged in a control circuit located in a region different from that of the sub-array pair 500. The TAG array memory 510A is connected to an X decoder 502A in each sub-array pair 500 whereas the TAG array memory 510B is connected with an X decoder 502B in each sub-array pair 500.

The DRAM, which utilizes the sense amplifier as a cache, must purge addresses in the TAG memory when data of the corresponding column sense amplifiers are renewed in a refresh operation. However, the TAG memory 510 shown in FIG. 2 cannot hold plural different TAG information in each of the decoders. Accordingly, when a sense amplifier (SA) relating to the X decoder 502 connected to the TAG memory 510 is refreshed, all the TAG addresses stored in the corresponding TAG memory 510 must be purged. As a result, this design of DRAM may experience a dramatically low hit rate, which is a drawback in the use of this design. Next, a DRAM with a cache in accordance with the present invention will be described in detail and will be shown to overcome the this problem.

First Embodiment

Figure 1:
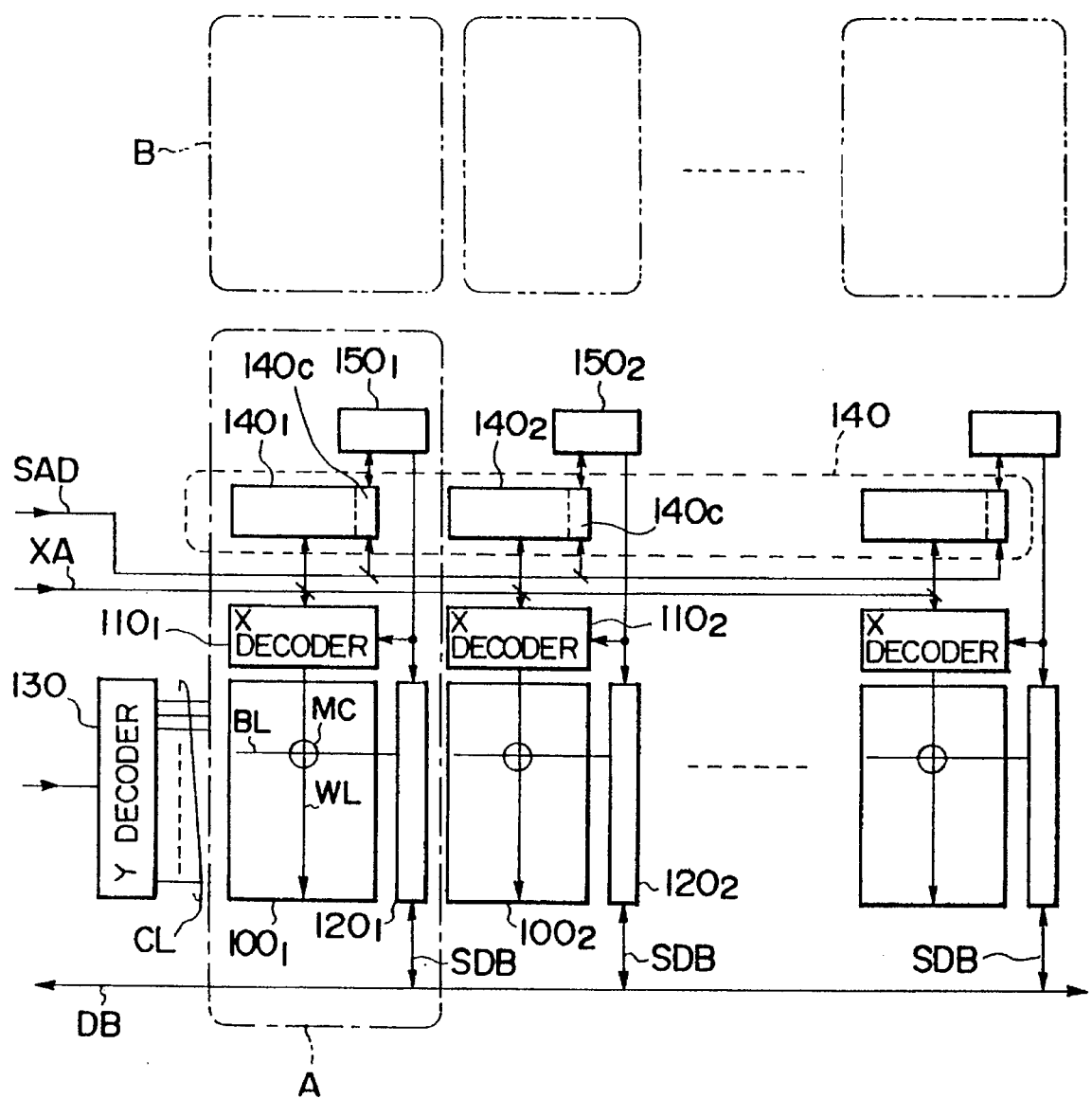
FIG. 1 is a block diagram of the first embodiment of a DRAM with a cache according to the present invention.

FIG. 1 is a block diagram of the first embodiment of a DRAM of the present invention.

The DRAM shown in FIG. 1 employs a TAG memory 140 including a plurality of TAG blocks 140$_j$ used to accomplish a high speed access operation. The DRAM includes plural word lines WL; plural bit lines BL; plural sub-arrays 100$_j$ (j=1, 2, 3, . . . .) which include dynamic type memory cells adequately disposed on the cross points between the word lines WL and the bit lines BL; plural X decoders 110$_j$ which decode the lower bits of the X address from the X address bus XA and selectively activate the word lines in each sub-array 100$_j$; plural column sense amplifiers 120$_j$ respectively connected with the bit lines BL of each sub-array 100$_j$; plural sub-data buses SDB respectively connected with each column sense amplifiers 120$_j$ through a switching circuit; a Y decoder 130 which decodes the Y address to turn on/off the switching circuit; and plural TAG memories 140$_j$. Since each column sense amplifier 120$_j$ operates as the cache to the corresponding sub-arrays 100$_j$, they are called, hereinafter, sense amplifier caches 120$_j$. Each sense amplifier cache 120$_j$ is connected with a data bus DB through a sub-data bus SDB.

The TAG memory 140, in a manner similar to the plural X decoders 110$_j$ incorporates plural TAG blocks 140$_j$ which accept the lower bits of the X address from the address bus XA and accept as the sub-array address the upper bits of the X address from a sub-array address line SAD.

Each of the TAG blocks 140$_j$ holds the lower bits of the input X address and issues a TAG determination signal in accordance with the X address. Each of the TAG blocks 140$_j$ is arranged in correspondence with the respective sense amplifier caches 120$_j$, the sub-arrays 100$_j$, and the X decoders 110$_j$. The sub-array addresses are provided to a block control circuit 140c in each corresponding TAG block 140$_j$. The DRAM shown in FIG. 1 employs plural sub-array control circuits 150$_j$ which provide control signals to the respective sense amplifier caches 120$_j$, the TAG blocks 140$_j$, and X decoders 110$_j$ in response to the information from each TAG block 140$_j$. A control unit controlled by each sub-array control circuit 150$_j$ is formed by the control signals from each sub-array control circuit 150$_j$. For example, the control signal from the sub-array control circuit 150$_1$, forms the control unit A shown with broken lines in FIG. 1, which in turn corresponds to the TAG block 140$_1$. A control unit B disposed in corresponding relation to control unit A is also shown, and will be described below.

Plural column lines CL driven by the Y decoder 130 are wired on each sub-array 100$_j$ and control the switch circuit between the sub-data bus SDB and each sense amplifier 120$_j$. The sub-data bus SDB is further connected with a data bus DB through the other switching circuit, if necessary. In the present embodiment, each X decoder 110$_j$ has a holding circuit to store the input X addresses.

Figure 3:
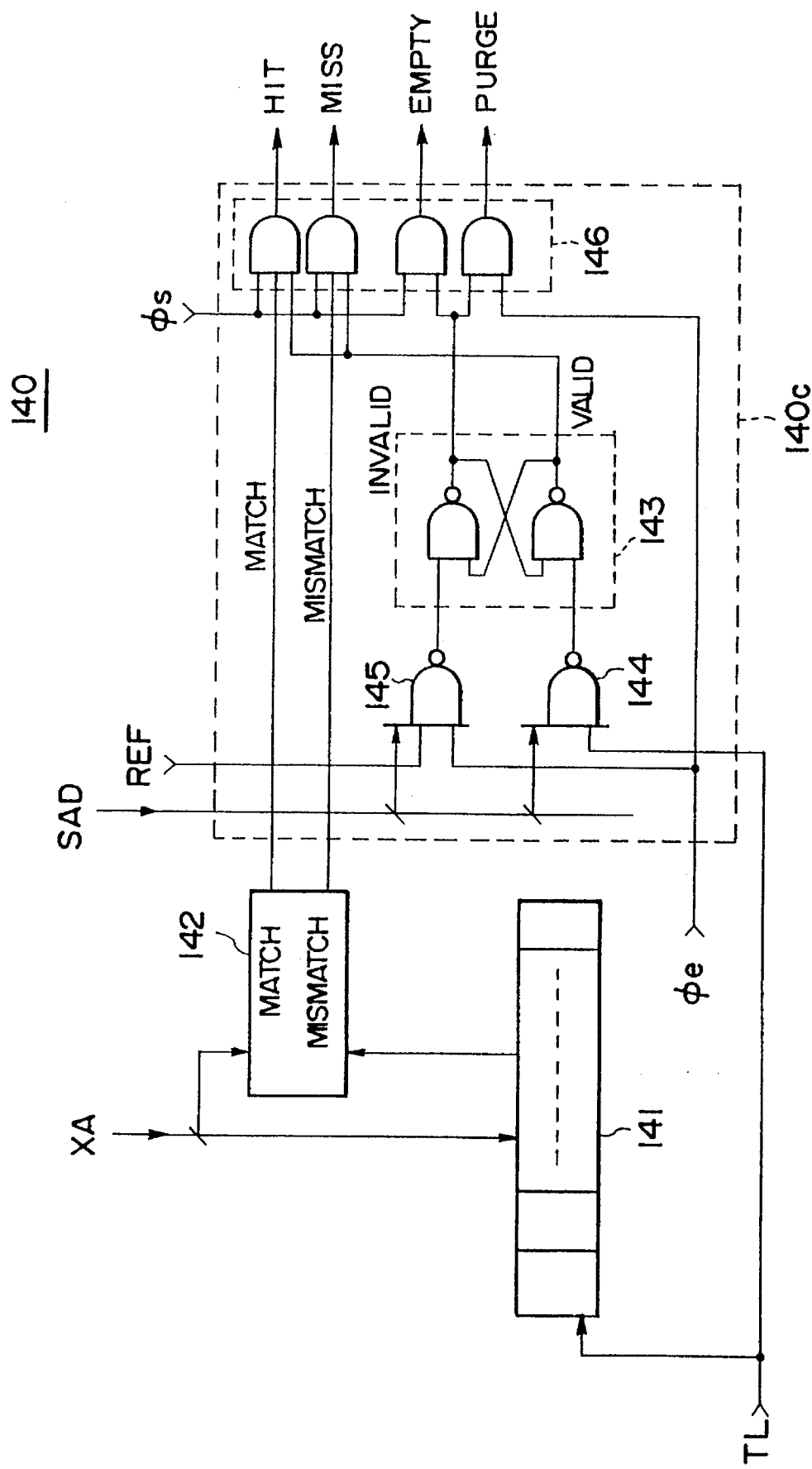
FIG. 3 is a block diagram of a detailed TAG block in the DRAM shown in FIG. 1.

FIG. 3 is a block diagram of the TAG block shown in FIG. 1. The TAG block incorporates a TAG address holding circuit 141 for loading the lower bits of the input X address XA in response to a TAG load signal TL and holding this as the TAG address; an address comparison circuit 142 for issuing either a "Match" or "Mismatch" signal by comparing the TAG address with lower bits of a newly received X address; and a block control circuit 140c for controlling the TAG block.

Each block control circuit 140c in turn employs a TAG flag 143 which holds the state (valid or invalid) of the TAG address. A signal SAD on the sub-array selection line and a TAG load signal TL are provided through a gate 144 to a reset terminal of the TAG flag 143. The refresh signal REF is also provided to the TAG flag 143 through a gate 145.

Timing signals Φe and Φs, the output signal from the TAG flag 143, and the output signal from the address comparison circuit 142 are provided to a gate 146, which issues a "HIT", "MISS", "EMPTY", or "PURGE" signal as a TAG determination signal.

In commencing each operation at the control unit, the TAG determination signal "HIT" is issued when "Match" and "Valid" are both satisfied, "MISS" is issued when "Mismatch" and "Valid" are both satisfied, and "EMPTY" is issued when the "Invalid" state is satisfied, notwithstanding whether either "Match" or "Mismatch" is found. In completion of each operation, the TAG determination signal "PURGE" is issued when the "Invalid" state is satisfied.

Figure 4:
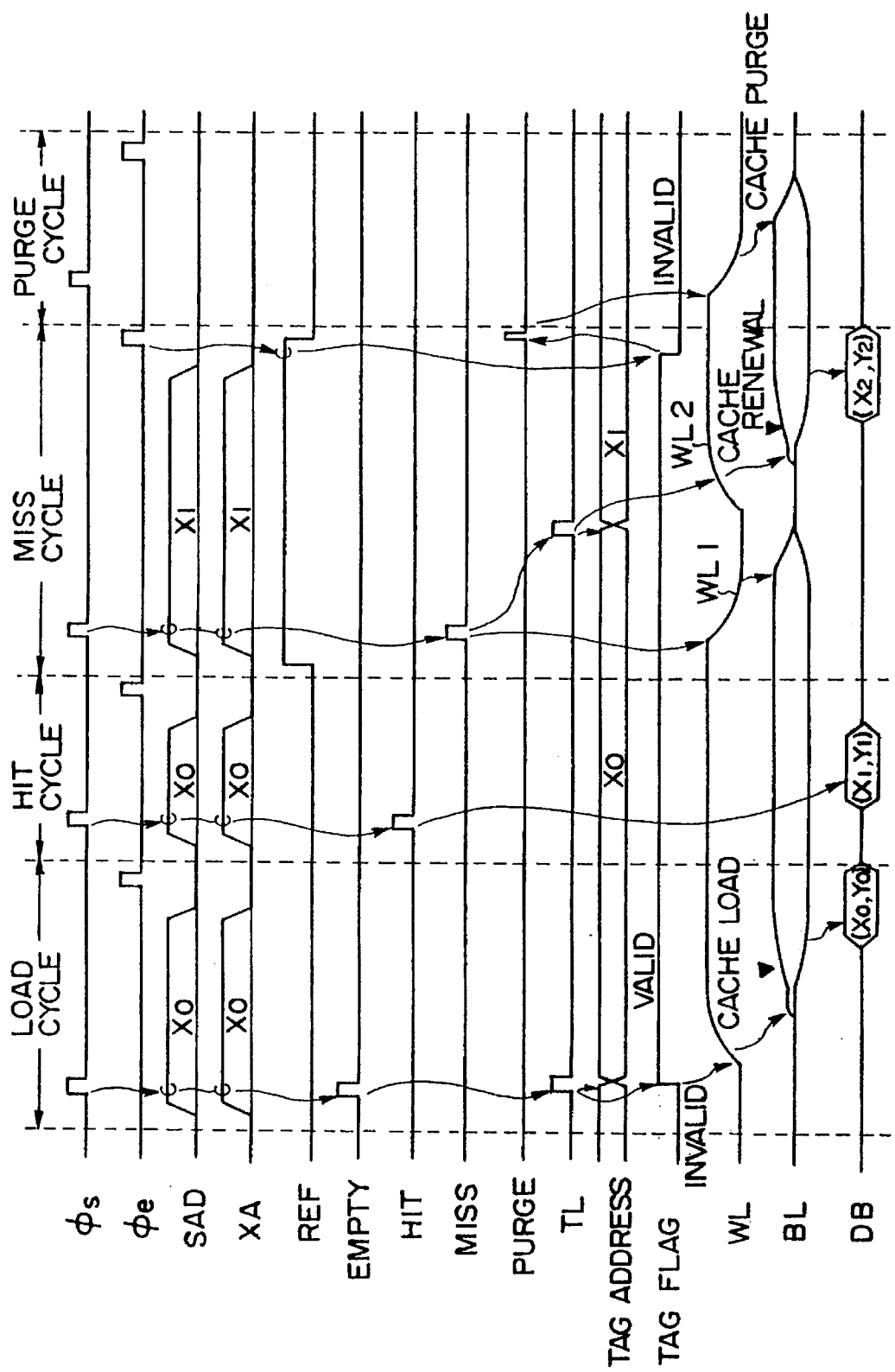
FIG. 4 is a timing chart of an operation of the DRAM shown in FIG. 1.

FIG. 4 is a time chart illustrating operation of the DRAM shown in FIG. 1. Operation of the DRAM shown in FIG. 1 now will be described in reference to FIG. 4.

At the initial stage of each operational cycle, one set of corresponding sub-arrays 120$_j$, TAG blocks 140$_j$, and sub-array control circuits 150$_j$ is selected by the sub-array address by each of the sub-arrays 110$_j$, the TAG blocks 140$_j$ and the sub-array control circuits and activated, respectively. Each waveform in FIG. 4 relates to the sub-array 110$_j$ activated by the sub-array address and to the TAG block 140$_j$.

There are four principal operational states in the DRAM shown in FIG. 1, which are (1) Load cycle, (2) Hit cycle, (3) Miss cycle, and (4) Purge cycle. In addition, even though there is also a No Operation (Nop) cycle during which another sub-array may be activated but no change occurs in the instant sub-array, further explanation will be omitted.

(1) Operation of the Load Cycle

At the beginning of the Load cycle, the word lines WL are reset (driven to a low logic level), the bit lines BL are equalized (driven to a level between high and low), and the TAG flag 143 (see FIG. 3) issues an "Invalid".

Accordingly, if the sub-array address SAD and the X address bus XA are defined, when timing signal $\Phi s$ is activated, the TAG determination signal "EMPTY" is activated to commence the Load cycle notwithstanding the state of the TAG address. The sub-array control circuit $150_j$ transmits the TAG load signal TL to the TAG blocks $140_j$ in response to the TAG determination signal "EMPTY" and loads information on the X address bus into the X decoders $110_j$. As a result, the TAG address is stored in the TAG address holding circuit 141 (see FIG. 3) in the TAG blocks $141_j$ and the X address is stored in the X decoders $110_j$. The X decoders $110_j$ decode the received X address to selectively activate the word lines WL so that a read-out voltage can appear on the bit lines BL. Consequently, the sense amplifier caches $120_j$ are activated by the sub-array control circuit $150_j$. Data from the bit lines BL are amplified and restored in the sense amplifier caches $120_j$. Further operations after cache loading will be similar to the well-known DRAM page mode operation.

In the activated sense amplifier caches $120_j$, when a Y address is defined, the column access operation will be performed on the sense amplifier designated by a column line CL. In other words, data are read or written through the data bus DB in response to the control of column line CL.

(2) Operation of the Hit cycle

At the beginning of a Hit cycle, the word lines WL are set (driven to a high logic level), the TAG flag 143 is "Valid", the TAG blocks $140_j$ hold the TAG address, the X decoders $110_j$ hold the X address obtained in the preceding access, and the sense amplifier caches $120_j$ hold the data obtained in the preceding access.

In this cycle, when the sub-array address SAD and the X address bus XA are defined, the address comparison circuit 142 (see FIG. 3) compares the TAG address with the information in the X address bus XA. If the TAG address and the X address are identical, the TAG determination signal "HIT" is activated to run the Hit cycle.

Further operations, though omitted in FIG. 4, are performed as follows:

The column access operation is performed under conditions where each state is maintained as it exists without change in the TAG blocks $140_j$ and the sub-arrays $100_j$.

(3) Operation of the Miss cycle

The initial state of the Miss cycle is similar to that of the Hit cycle. During this cycle, when the sub-array address SAD and the X address are defined, the address comparison circuit 142 compares the TAG address with the information in the X address bus XA. If the TAG address and the stored X address are not identical, the TAG determination signal "MISS" is activated to run the Miss cycle. The sub-array control circuit $150_j$ purges, in response to the TAG judgment signal "MISS", the X address stored in the X decoders $110_j$, and resets the word lines $WL_1$. Consequently, the sense amplifier caches $120_j$ are deactivated in response to the TAG determination signal "MISS" so that the data latched in the sense amplifier caches $120_j$ are purged and the bit lines BL are equalized. The sub-array control circuit $150_j$ then transmits the TAG load signal TL to the TAG blocks $140_j$.

The TAG blocks $140_j$ store new X address bus information, as the TAG address, into TAG address holding circuit 141 in response to the TAG load signal TL. Likewise, the X decoders $110_j$ store new X address bus information. As a result, the information stored in the TAG blocks $140_j$ and the X decoders $110_j$ are renewed. Then, a new word line $WL_2$ selected by the X decoders $110_j$ is set so that the read out voltage is generated on the bit line BL. Consequently, the sense amplifier caches $120_j$ are activated again by the sub-array control circuit $150_j$ and the voltage on the bit line BL is amplified and restored. In other words, data stored in the sense amplifier caches $120_j$ are renewed. After that, a column access operation will be performed.

(4) Operation of the Purge cycle

A Purge cycle is initiated after completion of a refresh operation. The Purge cycle shown in FIG. 4 illustrates an example in which the Miss cycle shown in FIG. 4 was a refresh operation. As shown in FIG. 4, if the Miss cycle was a refresh operation, a refresh signal REF (see FIG. 3) was activated during that cycle period. At the end of the Miss cycle, the TAG flag 143 (see FIG. 3) issues an "Invalid" signal when the timing signal $\Phi e$ is activated. The TAG determination signal "PURGE" is activated at the gate 145 in response to the "Invalid" signal. The sub-array control circuit $150_j$ performs the purge to the TAG memory 140 and the sense amplifier caches $120_j$ in the next cycle in response to the "PURGE" TAG determination signal. However, in the present embodiment, the actual information stored in the TAG memory 140 does not have to be reset because the TAG flag 143 was already set to "Invalid". Accordingly, only the sense amplifier caches $120_j$ are purged.

The circuit state at the beginning of the Purge cycle remains the same as that at the beginning of the Hit cycle. When the Purge cycle is initiated, the sub-array control circuit $150_j$ purges the information stored in the X decoders $110_j$ and resets the word line $WL_2$ already selected before the Purge cycle. Consequently, the sub-array control circuit $150_j$ deactivates the sense amplifier caches $120_j$ in accordance with the TAG determination signal "PURGE" and equalizes the bit line BL. In other words, data latched in the sense amplifier caches $120_j$ are purged.

As described above, according to the present embodiment, the TAG memory and the sense amplifier cache are controlled so as to perform a high speed access operation.

The present embodiment also has the following advantages.

(a) TAG blocks $140_j$ corresponding with the sub-arrays $100_j$ are activated during an access operation, including a refresh operation, such that only the TAG block corresponding to the refreshed sub-array is purged, whereas the TAG blocks corresponding to the remaining sub-arrays $100_j$ are not purged. In other words, the TAG memory is not unnecessarily purged so that even if the column sense amplifier is utilized as a cache, the overall chip size can be reduced while maintaining a high hit rate.

(b) Since the sense amplifier cache corresponding to the refreshed sub-array is purged in the following cycle, the word line WL and the column sense amplifier need not be reset again even when the instant sub-array is selected in the successive access operation. As a result, access time during a Miss operation can be reduced.

(c) There is, in general, no relation between the addresses affected during the refresh operation and those selected during the external data access operation. Thus, almost every access results in a Miss operation when a refreshed sub-array is again selected in the next access operation. Accordingly, an average mean value of the data access time is reduced due to the reduction in access time during a Miss operation as described previously.

(d) The sense amplifier caches $120_j$ are successively purged during refresh operations such that the sense amplifier caches $120_j$ become inactive and the bit line BL is equalized during the prescribed refresh period. Accordingly, a waiting current corresponding to a sub-threshold current can be reduced, compared with the current requirements of a conventional DRAM in which the bit line BL is waiting in a full swing state.

(e) Determination as to "HIT" or "MISS" of the TAG memory can be accomplished utilizing only the X address, obviating the need to define the Y address even when an address multiplexer type system is constructed. As a result, the word line WL of the sub-array can be initiated to reset faster during the Miss operation than a conventional DRAM can, reducing the access time.

The present invention is not limited to the first embodiment as various kinds of modifications can be made to the basic design, within the scope of the present invention. Examples of these modifications and variations are as described below.

(A) Plural sets of sub-arrays and TAG blocks can be concurrently activated during access time, including during a refresh operation. In this instance, the activated sub-array and TAG block set receives the same X address and is controlled in the same manner. For example, lines broken with two dashes in FIG. 1 show a control unit B that is accessed concurrently with the control unit A. Control unit B includes a sub-array, an amplifier cache, an X decoder, and a sub-array control circuit, and is controlled by various signals from the common TAG block 1401. Employing such a structure results in a DRAM in which input and output operations can be performed on multiple bits of data.

(B) In laying out the physical circuit, a configuration can be employed such that one TAG block and sub-array control circuit set can concurrently activate plural sub-array and TAG block sets at access time and during a refresh operation. As a result, the word line WL and the bit line BL, both of which have a large amount of parasitic capacitance, are divided such that high speed operation can be realized.

(C) At normal access time, each of the plural sub-array and TAG block sets is activated in a separate cycle. During a refresh operation, each is activated concurrently, thereby holding the TAG address with a number of the sub-arrays notwithstanding refresh specifications. Accordingly, a sufficient entry number of the TAG memories can be obtained, which improves the hit rate.

Figure 5:
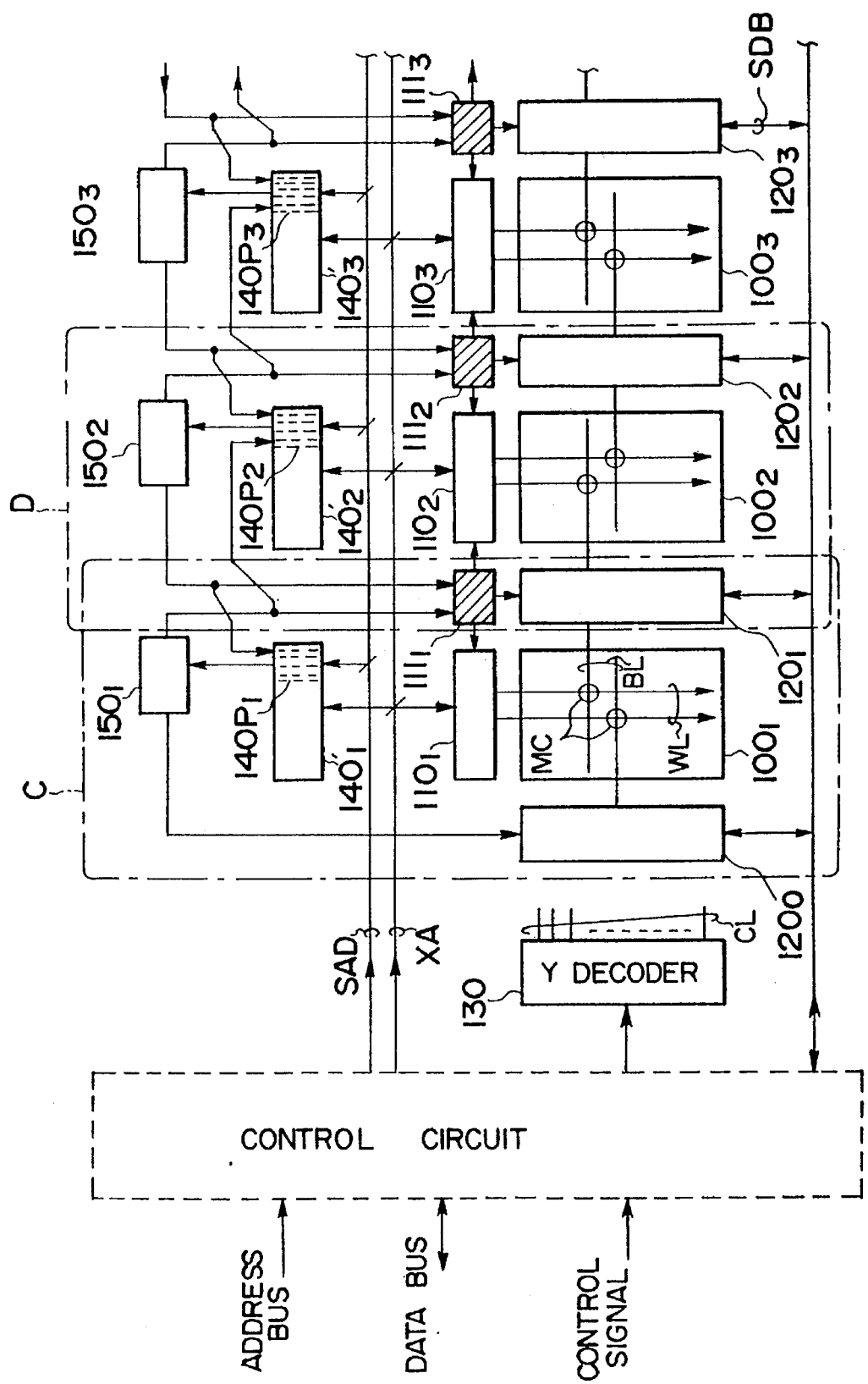
FIG. 5 is a block diagram of a modified example of the first embodiment shown in FIG. 1.

(D) A shared sense amplifier system in which the sense amplifier cache is mutually shared by adjacent sub-arrays can be employed. FIG. 5 is a block diagram illustrating an embodiment in which the shared sense amplifier system is employed.

The shared sense amplifier system is constructed such that adjacent control units C and D, which are similar to control unit A, share the sense amplifier 120 with each other. This is possible because control units C and D incorporate a sense amplifier mediation circuit $111_j$ which accepts output signals from the mutually adjacent sub-array control pair circuits $150_j$ and alternately validates one output signal while invalidating the other so as to establish timing for sharing of the sense amplifier 120.

In other words, the DRAM in accordance with the present system employs a mediation circuit $111_j$ which validates either one of the mutually adjacent sub-array control circuits $150_j$ and invalidates the other when providing an input for the sense amplifier cache 120. A purge circuit $140P_j$ is also disposed in the block control circuit in each TAG block 140 to detect whether the adjacent sub-array is activated or not before purging the contents of the TAG block. Use of the shared sense amplifier design can further facilitate construction of the circuit on a smaller size chip.

Second Embodiment

Figure 6:
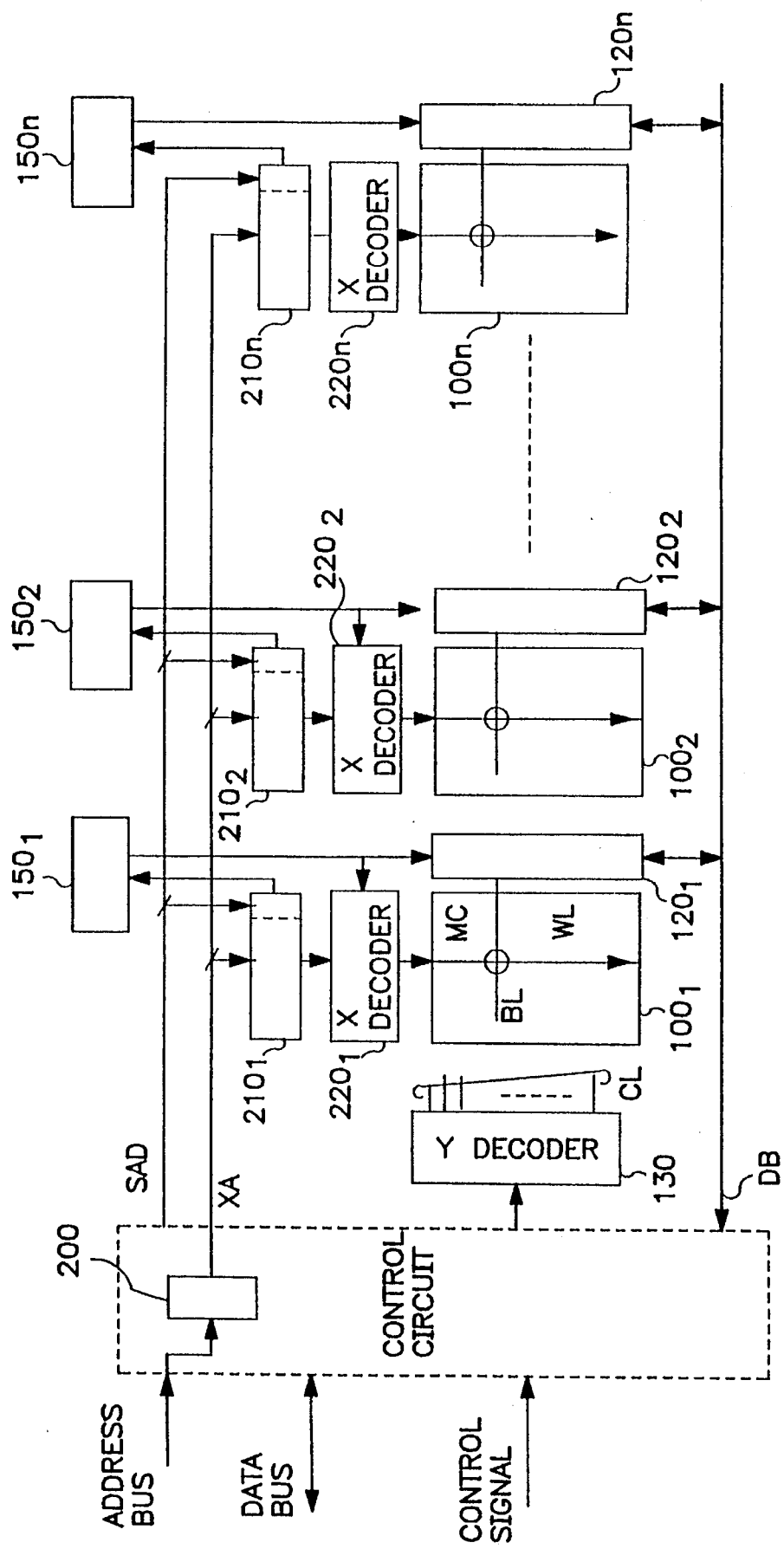
FIG. 6 is a block diagram of the second embodiment of a DRAM with a cache according to the present invention.

FIG. 6 is a block diagram illustrating a second embodiment according to the present invention. This embodiment incorporates a TAG block 210 that is different from the TAG block 140 shown in FIG. 1. As shown, the TAG block $210_j$ receives address lines from a first address decoder circuit 20 and, after processing, provides address outputs to a second decoder circuit $220_j$.

Figure 7:
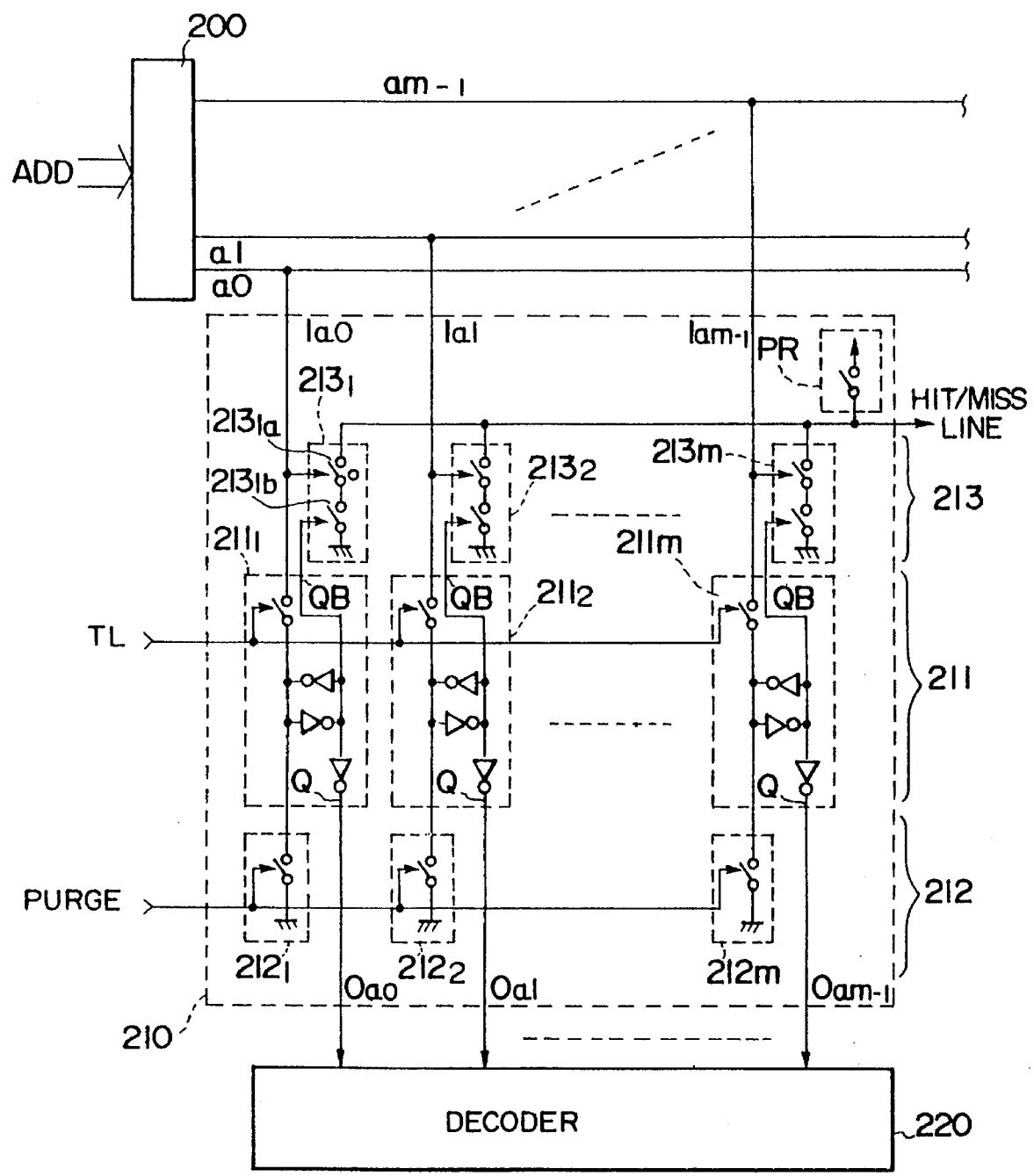
FIG. 7 is a block diagram of a decoder portion of the DRAM shown in FIG. 6.

FIG. 7 is a detailed circuit diagram of the TAG block 210 of FIG. 6. FIG. 7 shows a first decoder circuit 200 for providing an intermediate address over intermediate address bus elements $a_0, a_1, \ldots, a_{m-1}$, obtained by predecoding an address ADD; a TAG block 210 for loading and holding the intermediate addresses; and a second decoder circuit 220 for decoding the address and selecting the memory cell. The intermediate address bus elements $a_0, a_1, \ldots, a_{m-1}$, are connected to corresponding input terminals $Ia_0, Ia_1, \ldots, Ia_{m-1}$ of the plural TAG blocks 210, and the output terminals $Oa_0, Oa_1, \ldots, Oa_{m-1}$ are connected with the decoder circuit 220. The TAG block 210 incorporates a control circuit having an equivalent function to the block control circuit 140c shown in FIG. 3 which outputs an operational state signal indicating "EMPTY" or the like, as previously described.

As shown in FIG. 7, each TAG block 210 has address input terminals $Ia_0, Ia_1, \ldots, Ia_{m-1}$ with a bus width of the intermediate address bus elements $a_0, a_1, \ldots, a_{m-1}$.

Plural TAG address holding circuits $211_j$ are also provided for holding the TAG address, as are plural purge circuits $212_j$ for purging stored addresses in the TAG address holding circuits $211_j$ and plural address comparison circuits $213_j$, all of which are respectively connected with the address input terminals $Ia_0, Ia_1, \ldots, Ia_{m-1}$.

Each TAG address holding circuit $211_j$ has an output terminal Q through which the stored information is provided, and an output terminal QB through which the stored information is provided in inverted form. The output terminal Q of each TAG address holding circuit $211_j$ is respectively connected with the holding address output terminals $Oa_0, Oa_1, \ldots, Oa_{m-1}$.

The input terminal pair of each address comparison circuit $213_j$ is connected with the corresponding address input terminal $Ia_0, Ia_1, \ldots, Ia_{m-1}$ and with the output terminals QB of the TAG address holding circuits $211_j$. In other words, the input terminal pair of the i-th address comparison circuits $213_i$ is connected with the input terminal $Ia_{i-1}$ and with the output terminal QB of the TAG address holding circuit $211_i$. The output terminals of the address comparison circuits $213_j$ are commonly connected with a HIT/MISS line together with a precharge circuit PR. Although each TAG block 210 includes a control circuit which controls the block, description thereof is omitted. Further, a switch circuit included in the purge circuits $212_j$ or the like can be realized, for example, by employing a MOSFET, a gate of which is connected with a control line thereof.

Now, operation of the DRAM shown in FIG. 7 is described. Each address holding circuit $211_j$ in one TAG block 210 serves as the TAG address holding circuit 211 which stores one set of TAG addresses.

Similarly, each address comparison circuit $213_j$ serves as the address comparison circuit 213 for one TAG block whereas each purge circuit $212_j$ serves as one purge circuit 212 for all the TAG blocks. During the initial stage of each DRAM operational cycle, the HIT/MISS line is charged up to a high logic level by the precharge circuit PR.

When the address is defined, the decoder circuit 200 predecodes the address ADD to obtain the intermediate address which is provided to the intermediate address bus elements $a_0, a_1, \ldots, a_{m-1}$. Subsequently, in the TAG block corresponding to the sub-array which will be activated, the address comparison circuit 213 compares the TAG address with the intermediate address. The present embodiment works in such a manner that if these addresses are identical, the HIT/MISS line produces a high logic level, indicating a hit. For example, if the intermediate address $a_0$ and the corresponding address holding circuit $211_1$ are both at a high logic level, the output QB produces a low logic level. As a result, one of the switches, for example NMOS Transistor, $213_{1a}$ of the address comparison circuit $213_1$ turns on and the other switch, for example NMOS transistor, $213_{1b}$ turns off.

As described above, if each bit of the intermediate address is identical to the stored information of each corresponding address hold circuit, at least one of the two switch elements connected in series making up each address comparison circuit turns off so that the HIT/MISS line stays precharged, thereby keeping a high logic level, indicating a hit. If the TAG address and the intermediate address are not identical, there necessarily exists a bit i in which the stored information of the address holding circuit $211_i$ does not match the bit corresponding to one of the intermediate address bits ($a_i$). In this instance, the output QB of the address holding circuit $211_i$ becomes a high logic level, which causes both switch elements connected in series in the address comparison circuits $213_i$ to turn on. As a result, the HIT/MISS line will be pulled down to a low logic level.

Now, referring to FIGS. 8 and 9, explanation will be made as to why if the TAG address and the intermediate address are not identical, there necessarily exists a bit i in which the stored information of the address holding circuit $211_i$ does not match the bit corresponding to one of the intermediate address bits ($a_i$).

Figure 8:
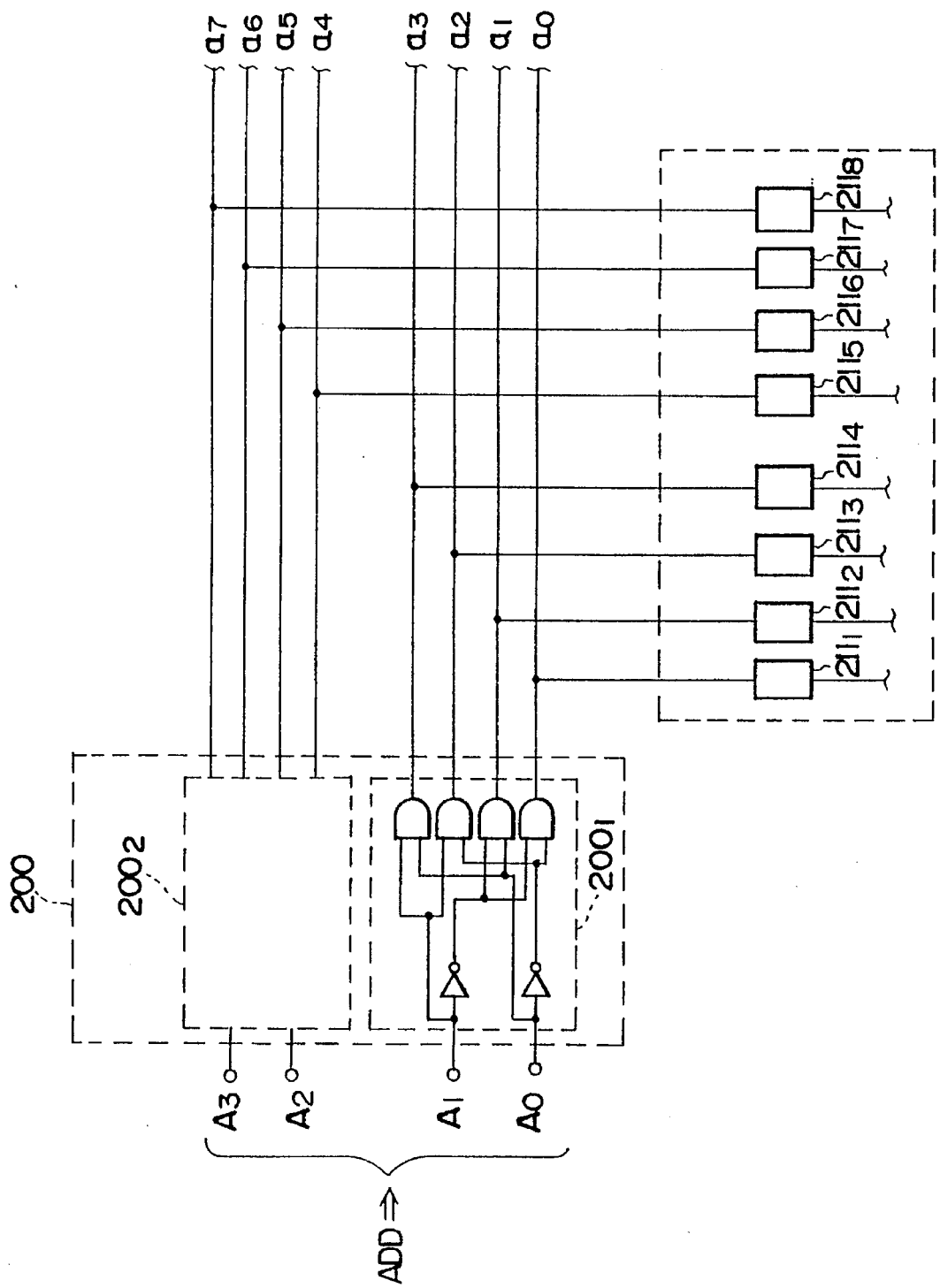
FIG. 8 is an example circuit diagram of the first decoder shown in FIG. 7.

FIG. 8 is a circuit diagram illustrating an example design for the first decoder circuit shown in FIG. 7.

Although FIG. 8 illustrates, for the benefit of a better understanding of the present embodiment, that the first decoder circuit 200 includes two 2-bit to 4-line decoders $200_1$ and $200_2$ in order to decode a 4-bit address input $A_3A_2A_1A_0$, the actual circuit may include many more 2-bit to 4-line decoders to accommodate different address requirements. The first decoder circuit 200 can also be designed so as to include a decoder having a different structure, such as an 8-bit to 8-line decoder.

FIG. 9 is a true/false logic table applied to the circuit of FIG. 8 when the intermediate address is active high. Since a complete logic table applied to the circuit of FIG. 8 actually illustrates 16×16 (=256) values, only a partial chart is shown in FIG. 9. Since the decoder circuit 200 employs the circuit configuration shown in FIG. 8, each bit code value for the intermediate address of the input address ADD is shown in FIG. 9 as $a_0$–$a_7$.

Accordingly, as shown in the determination result of FIG. 9, if the HIT/MISS line indicates "Mismatch", the TAG address holding circuit $211_j$, which corresponds to the bit $a_j$, an intermediate address of which reveals a high level, necessarily holds a low level and the second address comparison circuit $213_j$ becomes conductive so that a detection as to whether the TAG address matches or mismatches with the intermediate address can be made in the TAG block 210.

According to the present embodiment, if the bit code for the address ADD changes from the previously accessed code, the bit code for the intermediate address changes so that one of the address comparison circuits 213 becomes conductive, causing the output to indicate a "MISS" On the other hand, if the bit code for the address ADD remains the same as that on the preceding access, the address comparison circuit 213 indicates a "HIT". When a "HIT" is indicated, each circuit of the DRAM retains the same state and a column access operation will be performed. When a "MISS" is indicated, the load signal TL shown in FIG. 7 is activated so that the bit codes on the intermediate address bus elements $a_0, a_1, \ldots, a_{m-1}$ are loaded into the TAG address holding circuit 211. In the refresh operation, the purge signal "PURGE" is activated at the end of the cycle so that the purge circuit 212 resets the TAG address. As a result, all of the address output terminals $Oa_0, Oa_1, \ldots, Oa_{m-1}$ of the TAG block 210 are deactivated. On the other hand, there exists no address ADD which is predecoded into an inactive bit code so that when the TAG block 210 and the corresponding sub-array are activated again, the address comparison circuit 213 always indicates "MISS".

As described above, even though the decoder and the TAG memory are constructed such that the predecoded intermediate address must be provided, a determination can be made as to whether a "HIT" or a "MISS" occurred in the TAG. Accordingly, the sense amplifier can be controlled as a cache by employing an adequate number of sub-array control circuits.

The DRAM according to the present embodiment designed as disclosed above has the following advantages.

(f) Since the TAG memory receives the predecoded intermediate address, there is less restriction on its allocation so that even though it is allocated, for example, adjacent to the X decoder, no extra wirings are required, enabling a reduction in chip size.

(g) The number of bits required for the TAG memory will increase with respect to a conventional TAG memory if the address comparison is made on the TAG itself. However, the output of the address holding circuit 211 is provided to the second decoder circuit 220 so that the X decoder does not require the storing circuit therein which was required, for example, in the first embodiment. As a result, in a system which requires holding the address while setting the word line WL in accordance with the TAG address, the total circuit size can be reduced compared with a circuit utilizing conventional TAG memory. Since the TAG address holding circuit 211 generally serves as a buffer to the second decoder circuit 220, which has a large capacitance, the duty cycle for the intermediate address bus elements $a_0, a_1, \ldots, a_{m-1}$ can be reduced, providing a higher speed DRAM.

The second embodiment is not limited to be applied to the structure shown in FIG. 6.

The present invention is not limited to the design of the second embodiment as various kinds of modifications can be made to the basic design, within the scope of the present invention.

Another modified structure will now be shown. (E) FIG. 10 is a block diagram illustrating the shared sense amplifier system as applied to the second embodiment, featuring TAG blocks $140'_j$.

In this embodiment, which is similar to the control units C and D shown in FIG. 5, both a control unit E and an adjacent control unit F share the sense amplifier 120. This design requires a sense mediation circuit 111 in the control units E and F which alternately validates one of the outputs from the mutually adjacent sub-array control pair 150 and invalidates the other. Employing the shared sense amplifier design can facilitate making a DRAM with a small chip size.

Figure 10:
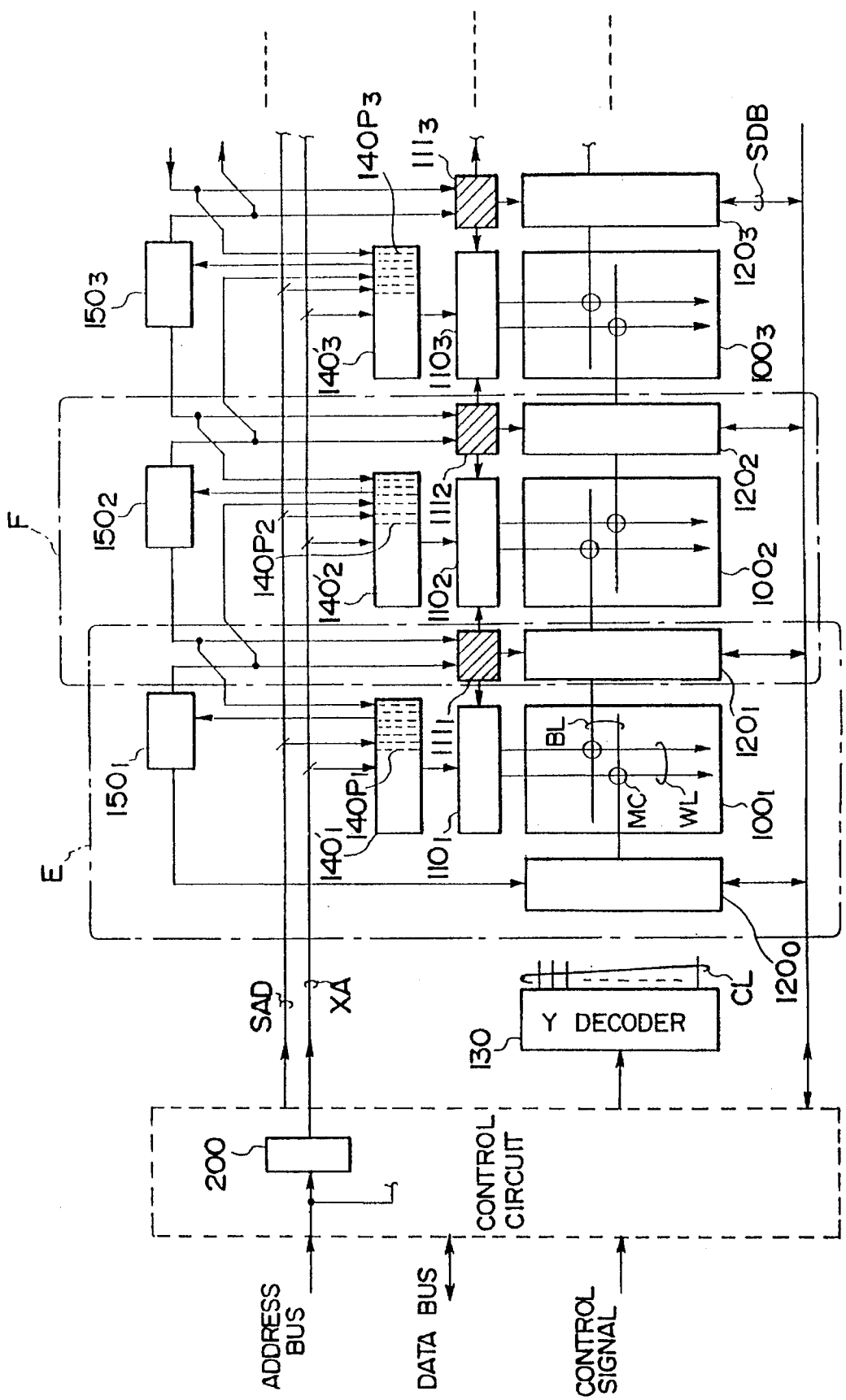
FIG. 10 is a block diagram of a modified example of the DRAM shown in FIG. 6.
Figure 11:
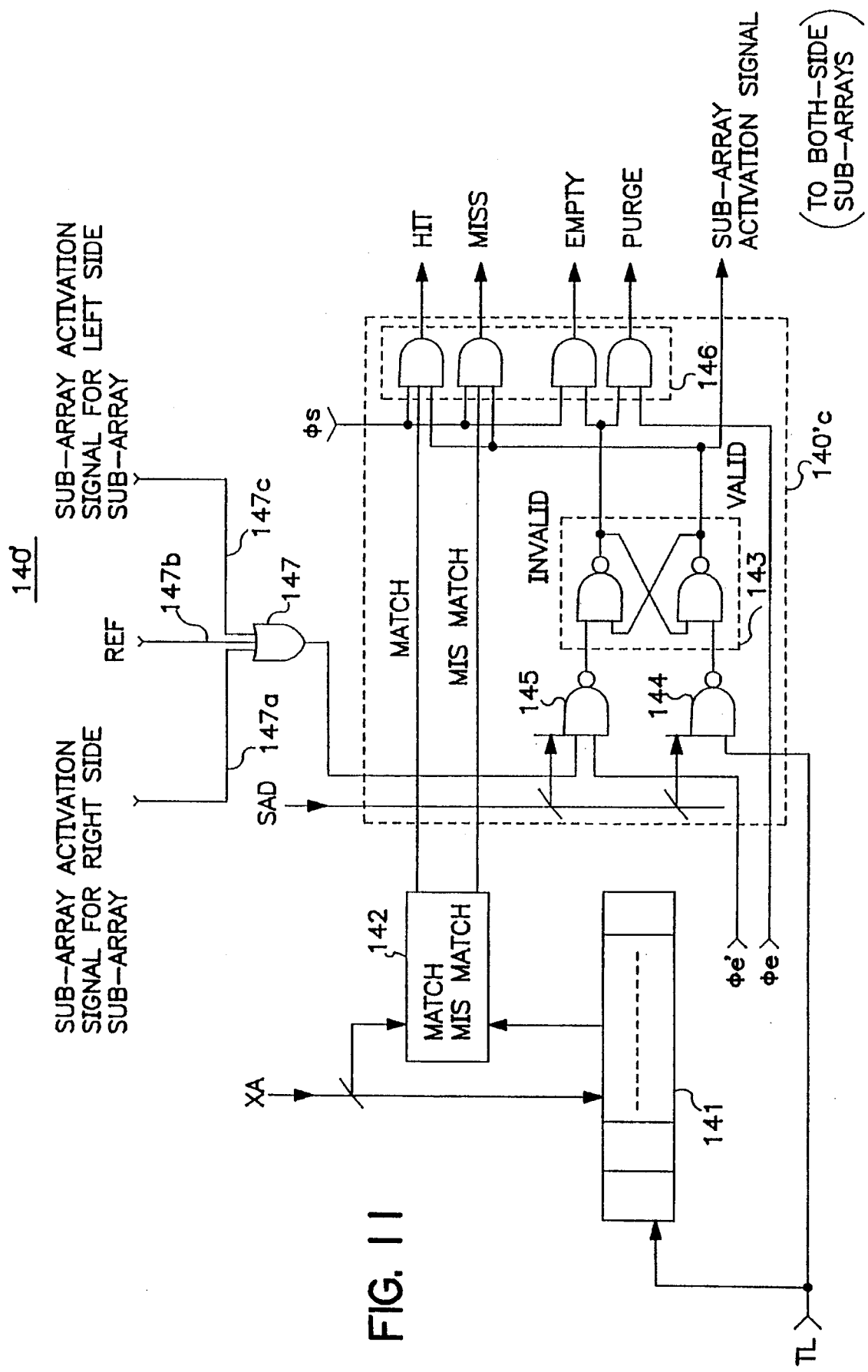
FIG. 11 is a block diagram of a detailed TAG block shown in FIG. 10.

FIG. 11 is a block diagram illustrating an example design of the TAG block 140' shown in FIG. 10. The TAG address holding circuit 141, address comparison circuit 142, TAG flag 143, and gates 144, 145, and 146 perform the same functions as like-numbered components described relative to the first embodiment. As illustrated in the drawing, the TAG block 140' according to the shared sense amplifier design employs an OR circuit 147 which receives an activation signal 147a for activating the adjacent right sub-array, a refresh signal 147b, and an activation signal 147c for activating the adjacent left sub-array.

The output of the OR circuit 147 is provided to one of the input terminals of the NAND circuit 145. The other input terminal of the NAND circuit 145 receives a timing control signal Φc' whereas the other input terminal of an AND gate which outputs "PURGE" receives another timing control signal Φc.

Further, the output indicating "Valid" among the outputs from the TAG flag 143 is supplied to both adjacent sub-arrays as the SUB-ARRAY ACTIVATION SIGNAL. The configuration of the TAG block 140' shown in FIG. 11 can be applied to the shared sense amplifier system shown in FIG. 5.

Third Embodiment

Figure 12:
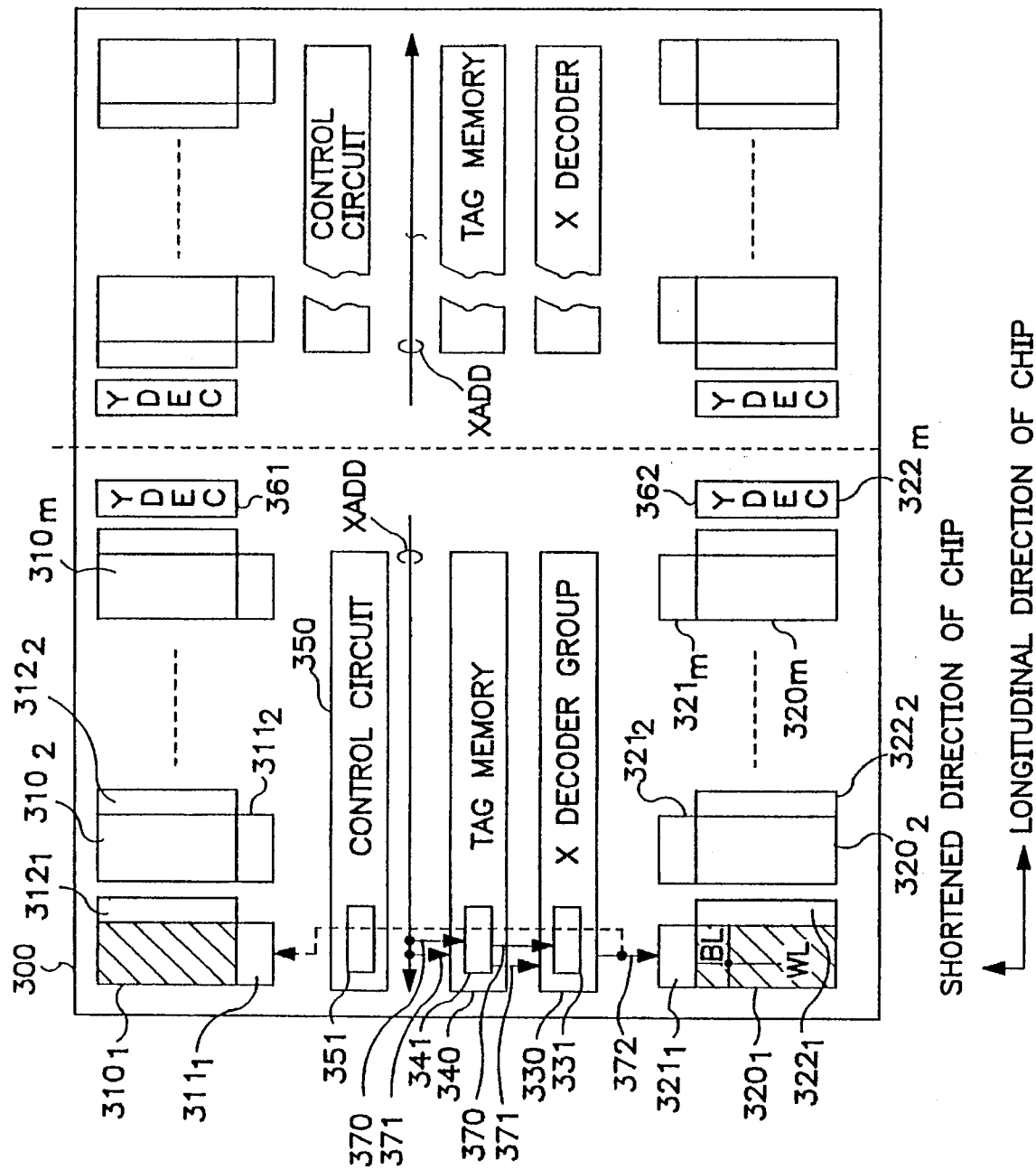
FIG. 12 is a layout of the third embodiment of a DRAM with a cache according to the present invention.

FIG. 12 illustrates the third embodiment of the present invention in which an example physical layout of the DRAM according to the present invention is shown.

The minimum requirement for the layout according to the present invention, including the first and second embodiments, is to arrange each TAG block 341 in the corresponding TAG memory 340 adjacent to the X decoder disposed in each sub-array 320 as shown in FIG. 12.

FIG. 12 shows the DRAM, all components of which are disposed on the same single chip 300. In the left region, there are provided sub-arrays $310_j$ and $320_j$ each having a plurality of memory cells which are respectively connected with the cross points between a plurality of word lines and bit lines; word line drivers $311_j$ corresponding to each sub-array; sense amplifier caches $312_j$ and $322_j$ which also work as caches in correspondence with each sub-array; an X decoder group 330 for decoding the X address; a TAG memory 340, a control circuit 350 including a plurality of sub-array control circuits; and two Y decoders 361 and 362 for decoding the Y address.

In the right region of the chip 300, the identical circuit is provided in the same manner, laid out symmetrical to the left region. A plurality of identical sub-array control circuits 351 are provided in the control circuit 350, and a plurality of TAG blocks 341 are provided in the TAG memory 340.

A plurality of the identical X decoders 331 are also provided in the X decoder group 330. In the DRAM as shown in FIG. 12, the intermediate address bus XADD obtained by predecoding the X address is wired at approximately the intermediate location of the shortened leg along the longitudinal direction and the TAG memory 340 is disposed along the intermediate address bus XADD.

The X decoder group 330 is disposed adjacent to and in parallel with the TAG memory 340. In the TAG memory 340, the TAG blocks 341 storing one set of the TAG addresses are arranged along the longitudinal direction of the chip, whereas in the TAG block 341, circuits corresponding to each bit of the address are also arranged along the longitudinal direction. The control circuit 350 is arranged along the intermediate address bus XADD at the side opposite the TAG memory 340.

A plurality of sub-arrays is disposed at the outsides of both the region where the TAG memory 340 and the X decoder group 330 are located. The sub-arrays $310_j$ are located at the upper side of the chip, whereas the sub-arrays $320_j$ are located at the lower side, as shown in FIG. 12.

Between each sub-array and the X decoder group 330, there are provided word line drivers $311_j$ and $321_j$ corresponding to each sub-array. Sense amplifier caches $312_j$ and $322_j$ are also disposed corresponding to each sub-array. Portions illustrated with oblique lines in FIG. 12 show the sub-arrays to be concurrently activated in the access operation. In other words, the sets of the sub-arrays which are concurrently accessed at both outside areas of the X decoder group 330 are provided. For example, both of the sub-arrays $310_1$ and $320_1$ are concurrently accessed.

A wiring example regarding the chip 300 will now be described. Wirings connected between the intermediate address bus XADD and each TAG block 341 in the TAG memory 340 and between each TAG block 341 and each circuit block 331 in the X decoder group 330 are formed using a first conductor 370. Wirings connected between the intermediate address bus XADD and the longitudinal direction of the chip in the TAG memory 340 and the X decoder group 330 are formed using a second conductor 371. Wirings connected between each circuit block 331 in the decoder group 330 and each word line driver $311_j$ and $321_j$ are formed using a third conductor 372.

The embodiment described above has the following advantages.

(i) The TAG block 341 in the TAG memory 340 is located adjacent to the X decoder 331 that corresponds to each TAG block 341 so that there is no need to provide useless lengthy wirings for connections therebetween, minimizing the wiring length. As to wirings between each TAG block 341 and the corresponding sub-array control circuit 351, there is also no need to provide useless lengthy wirings for connections therebetween, also minimizing the wiring length. Accordingly, increasing the chip size due to wiring considerations can be prevented.

(j) During a "MISS" operation in which the sub-array control circuit initiates the operation in accordance with the result of determination by the TAG memory, a DRAM access time delay can be reduced on grounds set forth in paragraph (i).

(k) Since a set of the sub-arrays concurrently activated is disposed on the outsides of the TAG memory 340 and the X decoder group 330 and arrayed opposing each other, the set of sub-arrays can be commonly controlled by one TAG block 341 and X decoder 331 set, thereby reducing the sizes of the TAG memory 340 and the X decoder group 330.

(l) Each word line driver $311_j$ and $321_j$ is disposed corresponding to each sub-arrays $310_j$ and $320_j$ so that in case of charge or discharge of a large amount of parasitic capacitance on the word line WL, noises on a power line can be diversified and reduced. Moreover, since each word line driver employs the gate circuit, X redundant cells can be replaced independently from the upper side sub-arrays on the lower side sub-arrays, which contributes to an improved yield.

Further, at the time of a "Miss" access, the operation to reset the missed sub-array and the operation to decode a new X address can be performed with partially or completely overlapping timing.

Figure 13:
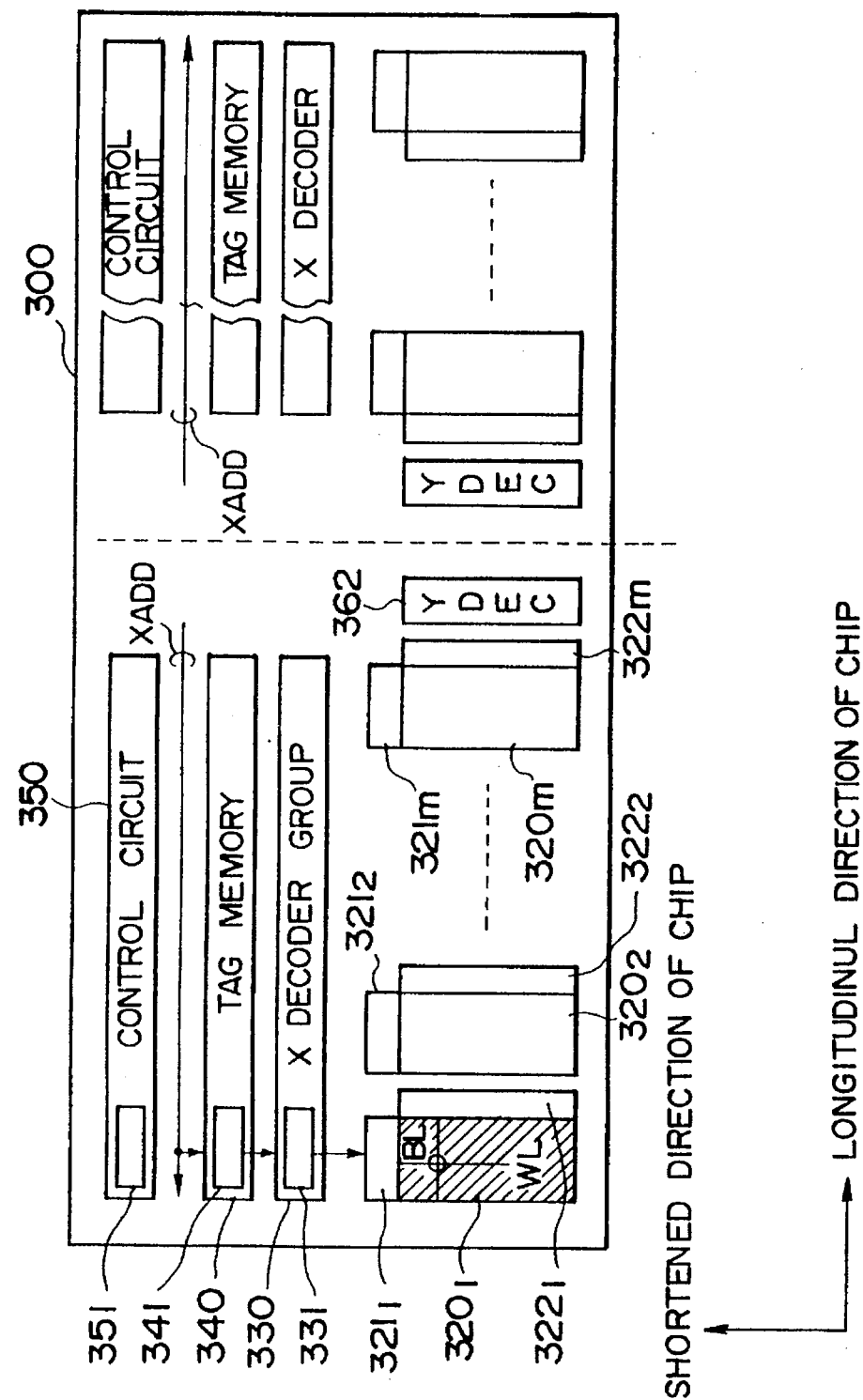
FIG. 13 is another layout of a DRAM with a cache according to the present invention.
Figure 14:
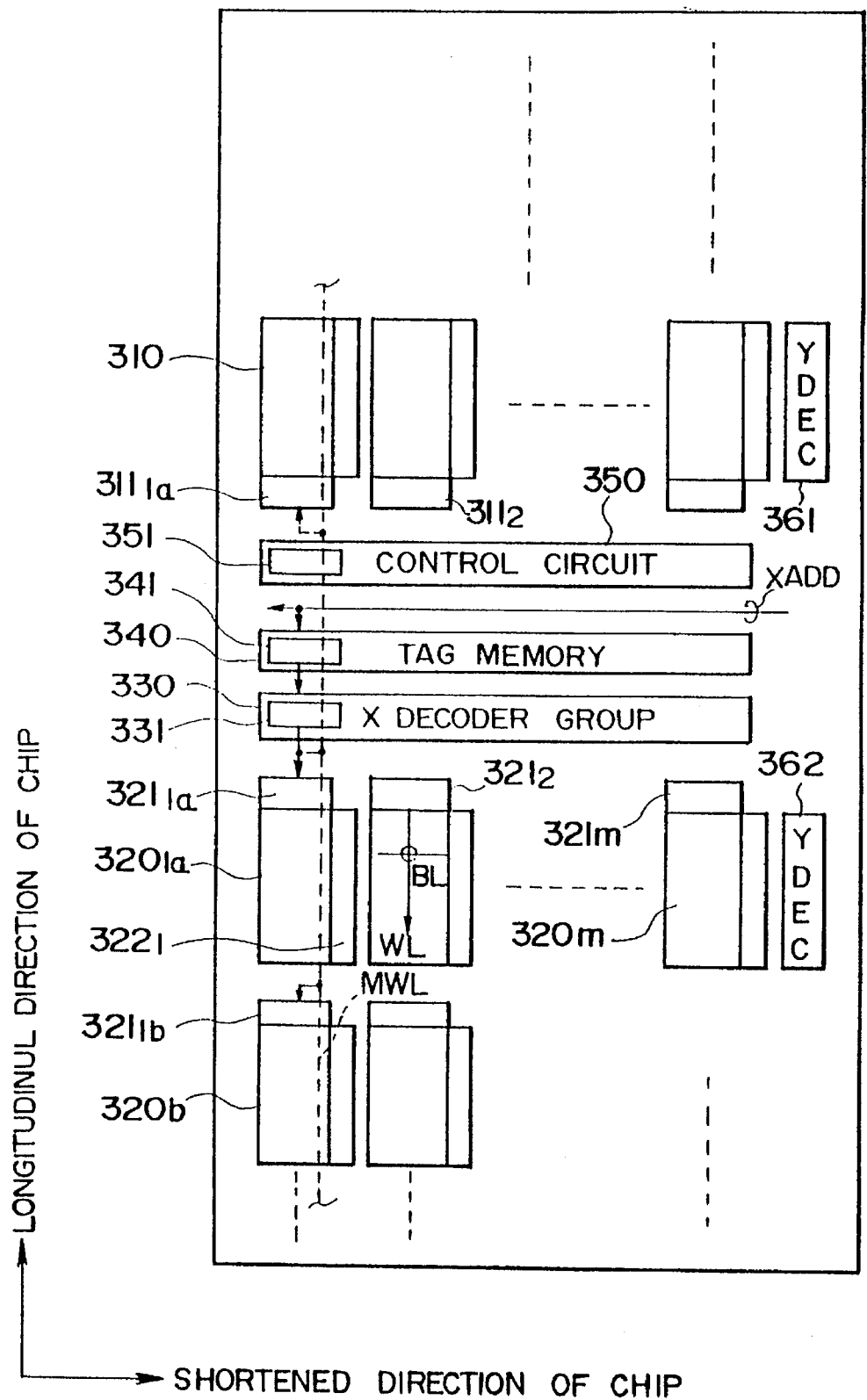
FIG. 14 is still another layout of a DRAM with a cache according to the present invention.

The layout of the DRAM according to the present invention is not limited to the pattern particularly illustrated in FIG. 12. In other words, the minimum requirement for the layout according to the present invention is, as described before, to dispose each corresponding TAG block 341 in the TAG memory 340 adjacent to the X decoders for each sub-array 320. Accordingly, any layout which satisfies the above conditions is acceptable. FIGS. 13 and 14 show examples of layouts satisfying such conditions.

It may be desirable from the viewpoint of speed to design a DRAM IC package which has bonding pads arranged only along one off the longitudinal edges of the chip. FIG. 13 shows an example of such a layout in which the control circuit 350, the TAG memory 340, the X decoder group 330, and the like are collectively disposed at the end of one of the longitudinal edges of the chip.

In FIG. 14, each sub-array 310 and 320 is disposed along the longitudinal edge of the chip. In this instance, the X decoder group 330 may be commonly disposed to each word line driver $321_{1a}$, $321_{1b}$ . . . , of the sub-arrays $320_{1a}$, $320_{1b}$ . . . , arranged along the longitudinal edge of the chip and may be connected with the main word line MWL which is wired as an upper wiring on the sub-array. As described above in detail, since the TAG memory according to the embodiment shown in FIG. 1 is constructed such that at least one TAG block, which stores one set of TAG addresses for the sub-arrays concurrently activated, is disposed to be plurally arrayed, the number of TAG blocks purged during a refresh operation can be minimized. Accordingly, a DRAM with a high hit rate can be realized while maintaining a small sized chip.

Further, since the TAG memory operates in such a manner as to determine a "Hit" or "Miss" without waiting for the definition of the Y address, access delay time can be reduced, for example, in the DRAM which utilizes an address multiplier type interface.

If a structure is utilized in which the sense amplifier used as a cache is purged after being refreshed, the waiting current present during the waiting period can be reduced.

Further reduction of the chip size can be realized if the structure of the DRAM shown in FIGS. 5 and 8 is employed, in which adjacent sub-arrays share the same sense amplifier cache.

In the DRAMs shown in FIGS. 6 and 7, the TAG memory provides the predecoded intermediate addresses so that there is no longer a restriction on the layout pattern. Even though the TAG memory is disposed, for example, adjacent to the X decoder, no increase in its occupying area occurs, notwithstanding the wiring, so that the total chip size can be reduced.

Further, since the TAG memory serves as a buffer for the decoder circuit, high speed operation can be accomplished.

Since the DRAM shown in FIG. 9 has a structure such that the X decoder and the TAG memory are disposed adjacent to and in parallel with each other in the central region of the chip, and a plurality of sub-arrays concurrently accessed is disposed facing each other at the outsides of the region where the X decoder and the TAG memory are allocated, the chip size can be reduced.

Moreover, various kinds of wirings can be shortened using the disclosed designs so that a high speed DRAM can be realized.

What is claimed is:

1. A dynamic RAM comprising:
   (a) an array of memory cells including a sub-array having a memory cell located at a cross point of a word line and a bit line;
   (b) an X decoder for decoding an X address of the sub-array and for selecting the word line;
   (c) a column sense amplifier for detecting and amplifying data on the bit line read out from the memory cell;
   (d) a sub-array control circuit for controlling the column sense amplifier as a cache; and
   (e) a TAG block corresponding to the sub-array for storing a TAG address only for the sub-array and for receiving and storing the X address.

2. A dynamic RAM as set forth in claim 1, wherein the TAG block includes a control circuit for purging the TAG block and the column sense amplifier after completion of a refresh operation on the sub-array.

3. A dynamic RAM as set forth in claim 2, wherein the array of memory cells includes a plurality of memory cell sub-arrays, the RAM further comprising a plurality of TAG blocks respectively corresponding to the sub-arrays, wherein the control circuit further activates the plurality of sub-arrays and the corresponding plurality of TAG blocks concurrently during an access operation and a refresh operation, and wherein the X address is provided by the X decoder to control the activated sub-arrays and TAG blocks.

4. A dynamic RAM as set forth in claim 2, wherein the array of memory cells includes a plurality of memory cell sub-arrays, the RAM further comprising a plurality of TAG blocks respectively corresponding to the sub-arrays, wherein the control circuit further activates the plurality of sub-arrays and the corresponding plurality of TAG blocks with each separate cycle during an access operation, and concurrently during a refresh operation.

5. A dynamic RAM as set forth in claim 1, wherein the X decoder is located adjacent to and parallel with the TAG block in a central region of a chip and the sub-array is located outside the central region.

6. A dynamic RAM as set forth in claim 1, wherein the TAG block further comprises:
   (a) a TAG address holding circuit for storing lower bits of the X address in response to a TAG Icad signal;
   (b) an address comparison circuit for comparing the TAG address with the lower bits of the X address and for issuing a comparison signal indicating a result of the comparison; and
   (c) a block control circuit for generating a TAG determination signal, including a TAG flag for storing a TAG address state and for accepting the comparison signal from the address comparison circuit; a sub-array address indicating upper bits of the X address; a refresh signal for refreshing the sense amplifier; and first and second timing signals.

7. A dynamic RAM comprising:
   (a) a plurality of sub-arrays, each sub-array including a plurality of memory cells, each of the memory cells being connected to a corresponding cross point between a word line and a bit line;
   (b) an X decoder for decoding an X address corresponding to one of the memory cells and for selecting the word line corresponding to the memory cell corresponding to the X address;
   (c) a column sense amplifier for detecting and amplifying data on the bit line read out from one of the memory cells;
   (d) a plurality of TAG blocks, each of the TAG blocks connected to a corresponding one of the sub-arrays, for storing a TAG address corresponding to the sub-array and for receiving the decoded X address;

(e) a plurality of sub-array control circuits for controlling the column sense amplifier as a cache; and (f) a sense amplifier mediation circuit for validating one of the sub-array control circuits and for invalidating another of the sub-array control circuits to regulate control of the column sense amplifier.

8. A dynamic RAM as set forth in claim 7, wherein each of the TAG blocks includes a control circuit for purging the TAG block and the column sense amplifier after completion of a refresh operation on the sub-array corresponding to the TAG block.

9. A dynamic RAM as set forth in claim 7, wherein the X decoder is located adjacent to and parallel with the plurality of TAG blocks in a central region of a chip and the plurality of sub-arrays is located outside the central region.

10. A dynamic RAM including a plurality of sub-arrays having a plurality of memory cells, the dynamic RAM comprising;

(a) a decoding circuit for decoding an address to provide an intermediate address;

(b) a TAG memory including a plurality of TAG blocks, each of the TAG blocks corresponding to one of the plurality of sub-arrays; and (c) a first intermediate address bus for passing the intermediate address between the decoding circuit and the TAG memory; each of the TAG blocks including:

(i) a TAG address holding circuit for storing the intermediate address and for providing the intermediate address to the decoding circuit;

(ii) an address comparison circuit for comparing an address on the intermediate address bus with a stored address in the TAG address holding circuit; and (iii) a purge circuit for deactivating all bits held by the TAG address holding circuit.

11. A dynamic RAM as set forth in claim 10, further including an X decoder located adjacent to and parallel with the TAG memory in a central region of a chip and wherein the plurality of sub-arrays is located outside the central region.

12. A dynamic RAM as set forth in claim 10, further comprising a column sense amplifier for detecting and amplifying data read out from one of the memory cells; a plurality of sub-array control circuits for controlling the column sense amplifier as a cache; and a sense amplifier mediation circuit for validating one of the sub-array control circuits and for invalidating another of the sub-array control circuits to regulate control of the column sense amplifier.

13. A dynamic RAM comprising:

(a) a plurality of sub-arrays, each sub-array including a plurality of memory cells, each of the memory cells being connected to a cross point between a word line and a bit line such that each sub-array includes a plurality of word lines and a plurality of bit lines;

(b) a plurality of TAG blocks, each of the TAG blocks being connected to a corresponding one of the sub-arrays, for storing a TAG address for the corresponding sub-array and for receiving an X address; and (c) a plurality of X decoders, one of the X decoders provided for each of the sub-arrays, for decoding the X address and selecting the word line corresponding to the X address; each of the TAG blocks being located adjacent to the X decoder provided for the corresponding sub-array.

14. A dynamic RAM as set forth in claim 13, wherein each of the sub-arrays is located outside of a region where the corresponding TAG block and the corresponding X decoder are located.

15. A dynamic RAM as set forth in claim 13, wherein the plurality of sub-arrays is located outside of a region where the plurality of TAG blocks and the plurality of X decoders are located.

16. A dynamic RAM as set forth in claim 13, wherein the bit lines included in each of the sub-arrays are laid out along a longitudinal leg of a semiconductor chip.

* * * * *